US006333531B1

United States Patent
Wang et al.

(10) Patent No.: US 6,333,531 B1
(45) Date of Patent: Dec. 25, 2001

(54) DOPANT CONTROL OF SEMICONDUCTOR DEVICES

(75) Inventors: Yun-Yu Wang, Poughquag; Johnathan E. Faltermeier, Lagrange; Philip L. Flaitz, Newburgh; Jeffery L. Hurd, deceased, late of Marlboro, by S. Kathleen Reese, administratrix; Rajarao Jammy, Wappingers Falls, all of NY (US); Radhika Srinivasan, Mahwah, NJ (US); Francis G. Trudeau, Wappingers Falls; Dinah S. Weiss, Poughquag, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/239,655

(22) Filed: Jan. 29, 1999

(51) Int. Cl.[7] ............................ H01L 27/108; H01L 23/48

(52) U.S. Cl. ........................ 257/301; 257/303; 257/304; 257/773

(58) Field of Search .................................... 257/296, 297, 257/298, 299, 300, 301–309, 773, 774; 438/243–249, 618, 629, 637, 639

(56) References Cited

U.S. PATENT DOCUMENTS

| 3,582,410 |   | 6/1971  | LaChapelle ........................ 438/347 |
|-----------|---|---------|---------------------------------------------|
| 3,775,196 |   | 11/1973 | Wakamiya et al. .................. 438/417 |
| 4,774,202 |   | 9/1988  | Pan et al. ............................. 257/317 |
| 5,017,505 |   | 5/1991  | Fujii et al. ........................... 438/594 |
| 5,393,687 |   | 2/1995  | Liang ................................... 438/532 |
| 5,394,012 | * | 2/1995  | Kimura ................................. 257/753 |
| 5,670,805 |   | 9/1997  | Hammerl et al. ..................... 257/301 |
| 5,739,565 |   | 4/1998  | Nakamura et al. ................... 257/301 |
| 5,867,420 | * | 2/1999  | Alsmeier .............................. 365/149 |
| 5,909,044 | * | 6/1999  | Chakravarti et al. ................ 257/301 |

FOREIGN PATENT DOCUMENTS 2-130871 * 5/1990 (JP) .

* cited by examiner

Primary Examiner—Tom Thomas
Assistant Examiner—Hung Kim Vu
(74) Attorney, Agent, or Firm—Ratner & Prestia; H. Daniel Schnurmann

(57) ABSTRACT

A process for forming a small grain structure in a material within a semiconductor device near the interface of an adjacent dissimilar material, to result in a highly diffusive grain structure. The highly diffusive grain structure formed within one material enhances diffusion of a dopant impurity, and provides for improved dopant control in an adjacent dissimilar material.

25 Claims, 6 Drawing Sheets

DOPANT CONTROL OF SEMICONDUCTOR DEVICES

TECHNICAL FIELD

The present invention relates to the process for producing improved dopant control in a semiconductor material. More specifically, the present invention relates to producing a high diffusion grain structure in one material through which impurities are diffused, so that the dopant control within another material is improved.

BACKGROUND OF THE INVENTION

It is a common practice within the semiconductor processing industry, to introduce a dopant impurity into one material by causing an impurity to migrate from another dissimilar material. A common example of causing an impurity to migrate from one material to another would be heat treating a semiconductor device to cause an impurity to be diffused from one material into a dissimilar, undoped material. An application of this procedure as it relates to a common semiconductor device, would include a dynamic random access memory (DRAM) device cell including a buried strap connecting a transistor to a trench capacitor. In a DRAM device including a buried strap, it is desirable to cause impurities to diffuse from a doped polysilicon electrode of the trench capacitor into the buried strap which connects the capacitor to the active area of the transistor, and then into the active area.

A common problem associated with causing an impurity to migrate from one material to another dissimilar material through an interface formed between two dissimilar materials, includes the effects of the interface upon the impurity migration. When an interface is formed between two materials, at least two known features can suppress the diffusion of a dopant impurity across the interface: the interface itself; and the grain structure of materials adjacent the interface.

This example, as it relates to the DRAM buried strap device, would involve the introduction of an impurity species from an amorphous/polycrystalline silicon buried strap, into the crystalline silicon structure comprising the active area of a transistor device formed within a semiconductor substrate. If the interfacial problem prevents extensive diffusion of dopant impurities from the buried strap and into the crystalline active area, an open will result and the electrical connection between the transistor and the capacitor will be faulty. Specifically, the device failure is caused when the dopant impurity in the trench is not diffused through the strap region, and into the active area resulting in electrical opens at low temperature conditions. Normally, the strap electrically connects a doped polycrystalline electrode of the trench capacitor to the active area through n-type doping.

Diffusion of an impurity through a material occurs fastest along grain boundaries. Thus, an electrically blocking crystal within the buried strap, with twinning and/or grain boundaries parallel to the interface between the active region, and generally orthogonal to the direction of the diffusion can disrupt the diffusion of impurities from the strap region into the active area. Generally, the buried strap is amorphous silicon, as deposited, and is converted to polycrystalline silicon which has a grain structure conducive to diffusion. Diffusion through a single crystalline silicon material, such as the active area, occurs at a much lower rate.

A common diffusion process used within the semiconductor industry, comprises utilizing a heating operation to simultaneously (a) convert an as-deposited amorphous silicon film into a polycrystalline structure, and (b) to cause diffusion of the dopant impurity from the amorphous/polycrystalline silicon region into the crystalline silicon region of the active area. The process is commonly used to urge diffusion of an n-type dopant impurity from the polycrystalline silicon of a buried strap into the crystalline silicon active area within a DRAM device. An associated problem with this process, however, is the formation of an electrically blocking, single crystalline grain structure forming in the polysilicon region near the interface between the polysilicon region and the crystalline silicon region. The single crystalline silicon structure of the active area "grows across" the interface and into the as-deposited amorphous silicon area if the interface between the two materials is smooth. In a trench DRAM, a heating process is used to produce buried strap polycrystalline silicon growth, and to enhance contact between the active area of the device and the trench capacitor by providing for the diffusion of a dopant impurity from one material (the polycrystalline buried strap being formed) to another material (the active area). It is found, however, that single crystal re-growth generates a dislocation in the active region which results in variable retention time failures.

One conventional approach to eliminating the formation of the electrically blocking, single crystalline region, is to prevent coherent nucleation at the interface between the two dissimilar materials. Coherent nucleation at the interface causes single grain growth adjacent the interface as a result of a smooth surface of the crystalline structure.

Another approach known in the art, which is directed to preventing the coherent nucleation of the crystalline surface, is using an "angle implant." The necessity for utilizing an angle implant is determined by the structure of the device. For example, a DRAM device using a buried strap structure connecting a trench capacitor to a transistor, requires angle implant because of the need to introduce a dopant into a surface which is substantially perpendicular with the substrate surface. This technique necessarily introduces an additional process step and thereby increases manufacturing complexity. Further, as devices become smaller, this step may become an even more significant source of other problems. This additional process step is more costly, requires more material and more time, and increases potential for error. Furthermore, the angle implant process is very difficult to control.

What is needed in the art is a method which helps generate a grain structure favorable for diffusion of dopant impurities in a region within a polycrystalline silicon material adjacent a crystalline silicon active area of a semiconductor device. Such a grain structure would enable, for example, diffusion of dopant impurities from a highly-doped polycrystalline silicon region of a trench capacitor, into a buried strap, then into the single crystalline active area of a DRAM device. By roughening the surface of a single crystalline material, such a grain structure is possible because a rough surface results in random nucleation sites at the interface which, in turn, will result in multi-grain growth in the polycrystalline silicon.

When a heating operation is used to cause the diffusion of an impurity from one material into another dissimilar material, crystal blocking at or near the interface significantly inhibits diffusion because impurity diffusion in perfect crystalline silicon is at least an order of magnitude slower than the diffusion along grain boundaries. In other words, "bulk diffusion" is at least an order of magnitude slower than the diffusion along grain boundaries. Depending on device dimensions, a single grain of silicon may be capable of slowing the intended dopant diffusion through, for example, a buried strap during thermal processing. When the strap is used to connect a trench capacitor to a DRAM transistor, the formed device structure would likely have low temperatures failures, as above.

SUMMARY OF THE INVENTION

In order to address the shortcomings of the prior art, the present invention provides a process for treating a crystalline surface which will form the interface between two dissimilar materials, in order to prevent single crystalline growth across the interface and into the adjacent region of the dissimilar material, such as amorphous silicon. This may eliminate the chance of dislocation formation due to crystal re-growth in the adjacent region and may enhance diffusion of an impurity from the adjacent, dissimilar material into the crystalline region. In order to reduce the chance of single crystal grain growth, or coherent growth, at the interface between the dissimilar materials, a disruption of coherent growth is created by roughening the surface of crystalline silicon and by adding a thin oxide or other film, before the amorphous silicon is deposited, adjacent the surface to form an interface. The rough interface acts as an incoherent, random grain growth site at the interface, which results in multi-grain growth in the amorphous silicon as it is being converted into a polycrystalline silicon material. The multi-grain growth at the interface results in multi-grain boundaries in the polysilicon, which may enhance the impurity diffusion from the amorphous silicon (at least part of which is now polycrystalline silicon), to the crystal silicon. Since the diffusion of an impurity into the crystalline region is not impeded, superior dopant control within the crystalline material being doped, can be achieved.

The present invention utilizes a diluted hydrofluoric acid clean to roughen the surface of the crystalline structure.

BRIEF DESCRIPTION OF THE DRAWING

The present invention is best understood from the following detailed description when read in conjunction with the accompanying drawing. It is emphasized that, according to common practice, the various features of the drawing are not to scale. On the contrary, the dimensions of the various features are arbitrarily expanded or reduced for clarity. Included in the drawing are the following figures.

FIG. 1 is a cross-sectional view showing a trench capacitor formed adjacent an active area;

FIG. 2 is a cross-sectional view showing the structure of FIG. 1 after the surface of the active area has been roughened;

FIG. 3 is a cross-sectional view showing the structure of FIG. 2 after a film has been introduced onto the roughened surface;

FIG. 4 is a cross-sectional view showing the structure of FIG. 3 after an amorphous silicon film has been introduced;

FIG. 5 is a cross-sectional view showing the structure of FIG. 4 after part of the amorphous silicon film has been converted to polysilicon film;

DETAILED DESCRIPTION OF THE INVENTION

Figure 1:
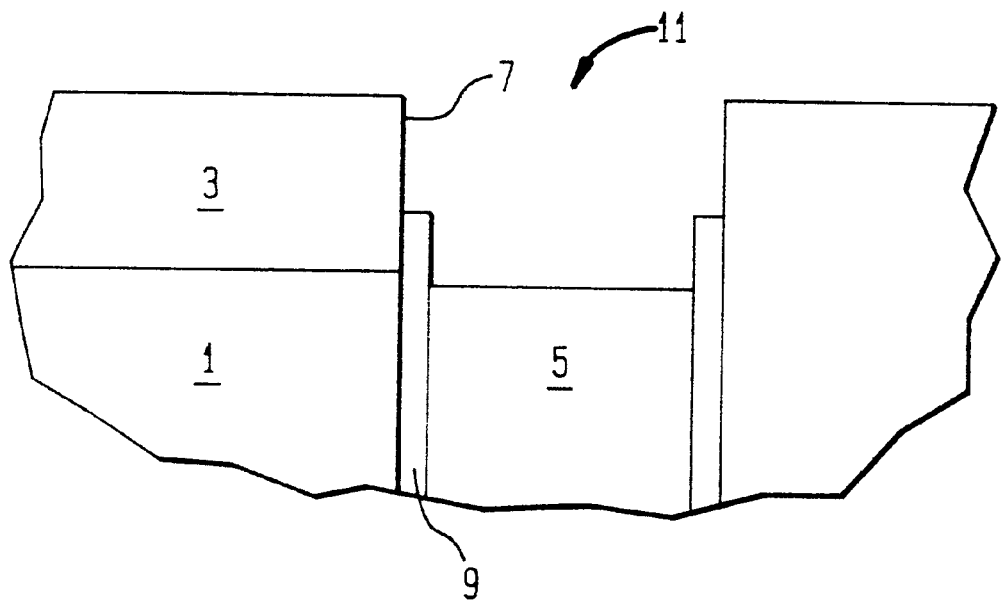
FIGS. 1 through 5 are cross-sectional views of an exemplary embodiment of the present invention sequentially depicting the process of the present invention.

The structure and processes of the present invention can be best described in conjunction with the drawing. The following features highlight the advantages of the present invention:

1. Improved dopant control can be achieved in one material by influencing grain growth in an adjacent material.

2. A faster and more efficient method for diffusion is provided. The present invention takes advantage of the phenomenon that the diffusion of a dopant impurity along grain boundaries of a polycrystalline material is one order of magnitude faster than diffusion through a bulk crystalline material.

3. A treatment is provided to roughen the surface of one material, which prevents coherent nucleation and urges random, multiple nucleation sites which, in turn, will cause multiple grain growth and prevent twinning or crystalline formation in a subsequently-deposited adjacent, dopant-source material. This urges polycrystalline silicon formation in the dopant source material instead of the highly twinning single silicon crystalline material which impedes diffusion. Polycrystalline silicon generates a diffusion grain boundary which allows impurities to diffuse through to the undoped crystalline region. In an alternate embodiment, the present invention also utilizes an actively formed thin oxide or other film along the interface between the two dissimilar materials to further prevent the crystallization of the dopant source material which suppresses impurity diffusion.

4. The present invention is useful in various semiconductor device structures where a dopant impurity is being diffused from one material into a dissimilar crystalline structure of a second material. One common application may be in the use of the present invention for an as-deposited amorphous silicon, buried strap, connecting a trench capacitor to the crystalline active area of a semiconductor device. Another application of the present invention may be in the use of an as-deposited amorphous silicon via plug making connection to the crystalline source/drain doped substrate area of a semiconductor device.

5. The process of the present invention does not require an angle implant, which is difficult to control and may become more difficult to control as integrated circuit devices become progressively smaller.

6. The method of the present invention does not require any additional processing steps to carry out the surface treatment, but is added to the existing pre-clean sequence preceding an amorphous silicon deposition process.

Now turning to the drawing, FIG. 1 shows a cross-section of a structure which will use an exemplary embodiment of the present invention to facilitate improved dopant control and improved impurity diffusion through the structure. FIG. 1 shows a trench 11 formed within a silicon substrate 1. Trench 11 will serve as a trench capacitor. The trench capacitor includes a doped polysilicon electrode 5 and is isolated by collar oxide 9. Crystalline material will form an active area 3 of a transistor device (not shown) and is the material which will have a dopant impurity added during a subsequent process step according to the present invention. In an exemplary embodiment, active area 3 may additionally include a further, oppositely-charged dopant species as formed, and prior to the dopant impurity added according to the diffusion process of the present invention. First surface 7 will form part of the interface between the active area and a buried strap (to be added in a further process).

Figure 2:
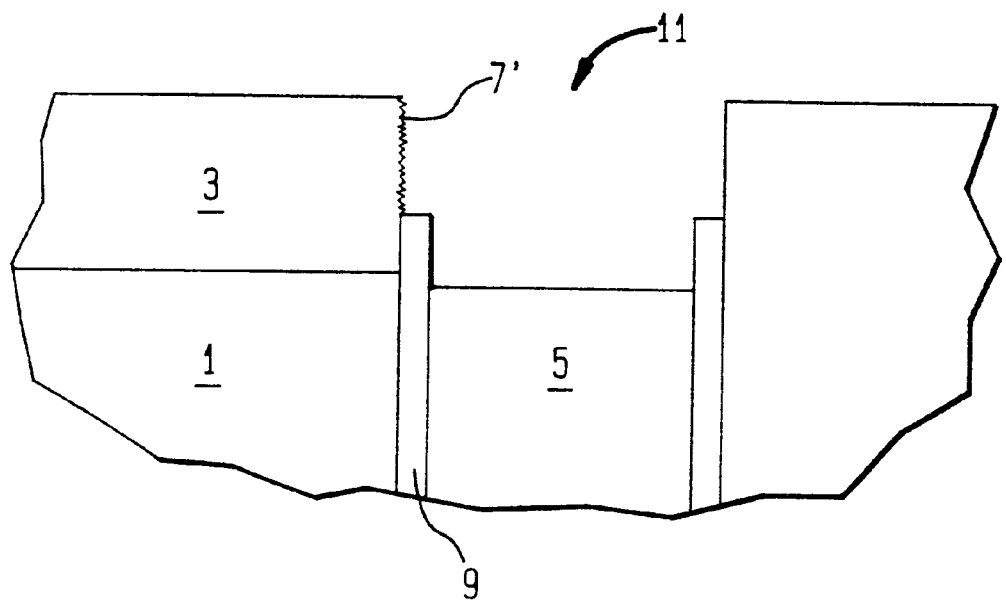

FIG. 2 shows the structure depicted in FIG. 1 after original first surface 7 of FIG. 1 has been treated by a method of the present invention to form roughened surface 7'. In the preferred embodiment, the treatment method utilizes a dilute hydrofluoric acid (DHF) solution of a composition including 200 parts water and one part hydrofluoric acid. In an alternate embodiment, a solution comprised of a mixture of dilute hydrofluoric acid and nitric acid may be used. In another embodiment, the structure may be annealed in argon at a temperature of approximately 1000° C. Roughened surface 7' provides multiple nucleation sites, from which the grain growth in a not-yet-deposited material will be influenced.

Figure 3:
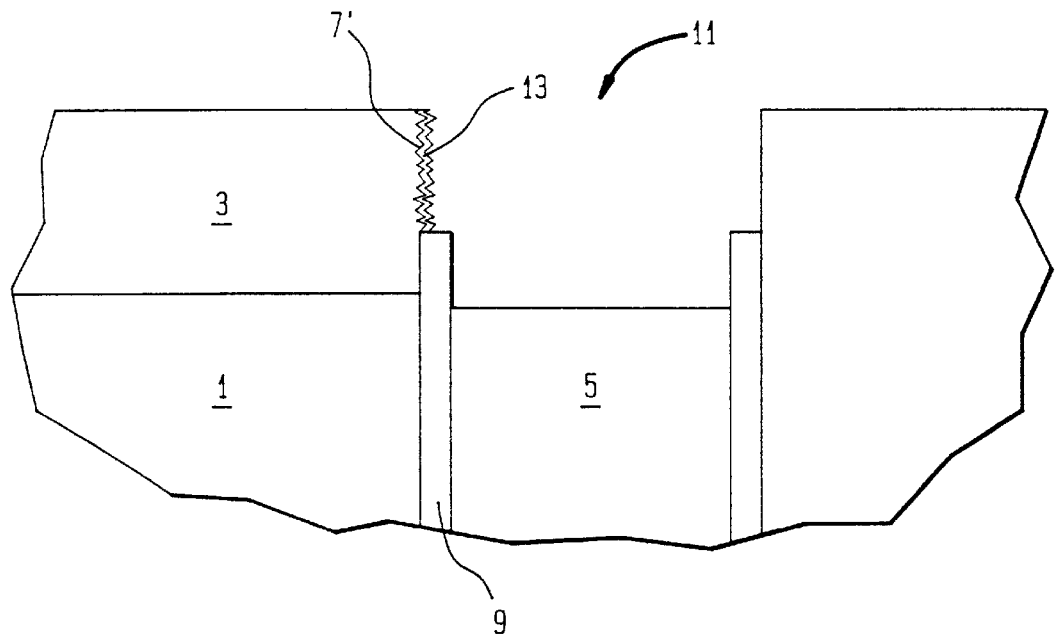

Now turning to FIG. 3, an alternate embodiment of the present invention is shown. A thin film 13 is formed on roughened surface 7' of the structure. In an exemplary embodiment, the thin film 13 may be a very thin oxide film, but other very thin films may be used. The thin film 13 may be as thin as a single monolayer. Thin film 13 may be formed using any method suitable in the art. The function of thin film 13 is also to suppress crystalline growth in the material which will subsequently deposited to form the interface with silicon active area 3, and which will also serve as the source of impurities which will be diffused from the not-yet-deposited material into the active area 3. In the preferred embodiment, thin film 13 is not required as determined by process conditions of the treatment process and/or the amorphous silicon deposition process which will follow.

Figure 4:
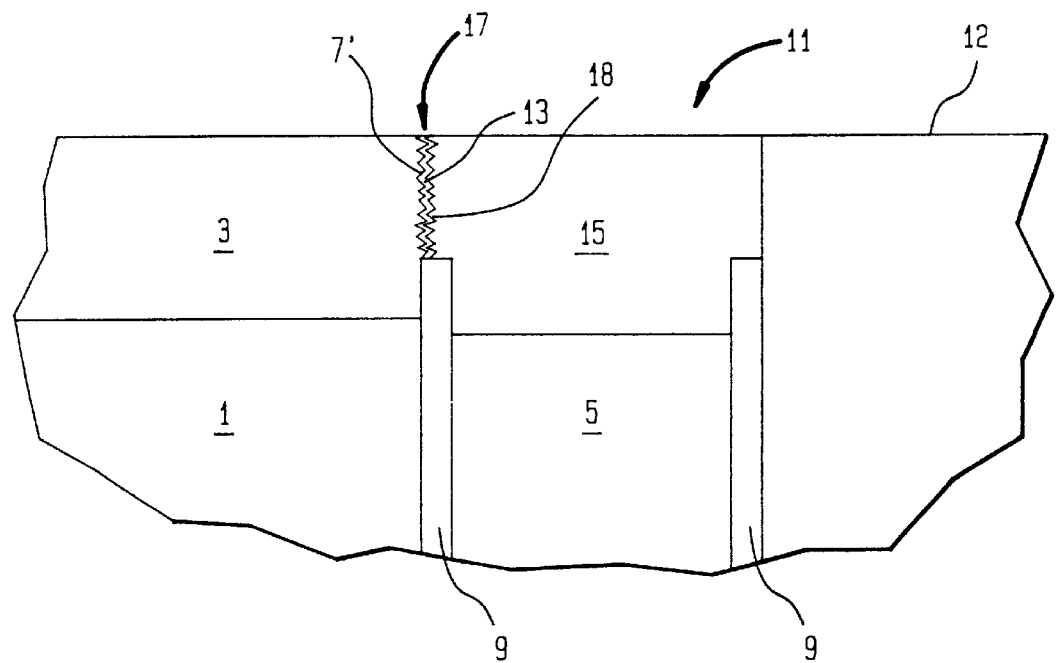

FIG. 4 shows an alternate embodiment of FIG. 3 after the following step in the processing sequence. FIG. 4 includes thin film 13, which may be an oxide film. Amorphous silicon film 15 has been added to the structure to fill the void within the trench 11 and which will serve as a buried strap connecting the doped polysilicon electrode 5 of is the trench capacitor to the active area 3, forming an electrical connection. The method for adding the amorphous silicon film 15 to the structure may be any method suitable in the art, but in the preferred embodiment an LPCVD (low pressure chemical vapor deposition) procedure may be used. Likewise, the method for removing any amorphous silicon film from above the top surface 12 of the semiconductor device may be any method suitable in the art. In the preferred embodiment, chemical mechanical polishing (CMP) may be used. Upon deposition, the amorphous silicon film 15 includes a second surface 18 which forms an interface 17 with first surface 7' of the active area 3. Also included in the interface, in the alternate embodiment as depicted in FIG. 4, may be thin film 13. In the preferred embodiment, the thin film 13 may not be necessary.

Figure 5:
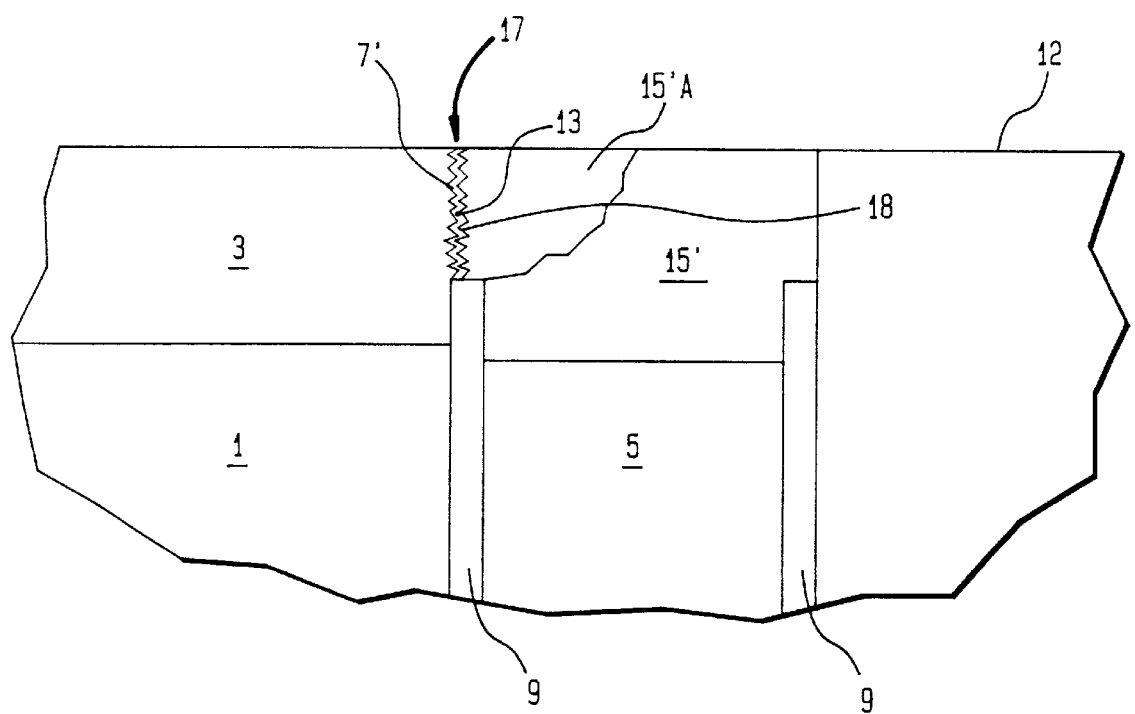

FIG. 5 shows the structure depicted in FIG. 4 after the structure has been heat treated. The heat treatment converts the film, which was deposited as amorphous silicon (feature 15 in FIG. 4) into a polycrystalline silicon (polysilicon) film 15' as depicted in FIG. 5. The thermal process used to convert amorphous silicon into polycrystalline silicon may be any process suitable in the art. In the preferred embodiment, heating at 550° C. for 10 minutes, in an ambient nitrogen environment, may be used. The polysilicon film 15' includes a region 15'A adjacent to the interface 17. The area 15'A is a critical region with respect to diffusion of impurities from doped polysilicon region 5 into formed polysilicon region 15' and into the active area 3 of the device. The grain structure formed within adjacent region 15'A, as influenced by the interface 17 between films 15' and 3, is significant to the present invention. The effect of grain structure within the region 15'A can be seen in an expanded view of the present invention as seen in FIGS. 6A and 6B.

Figure 6A:
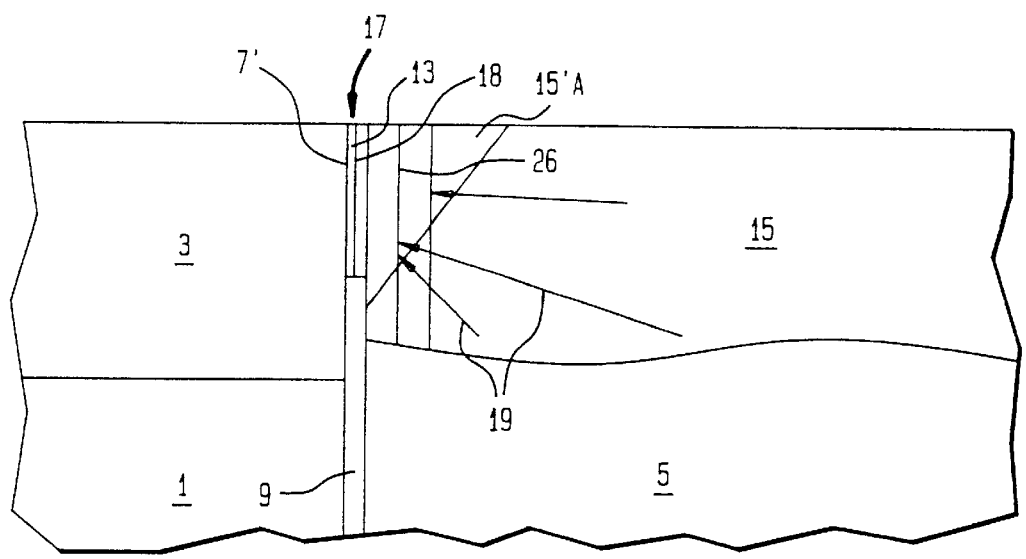
FIG. 6A is a cross-sectional view showing an expanded view of electrically blocking crystals according to the prior art.
Figure 6B:
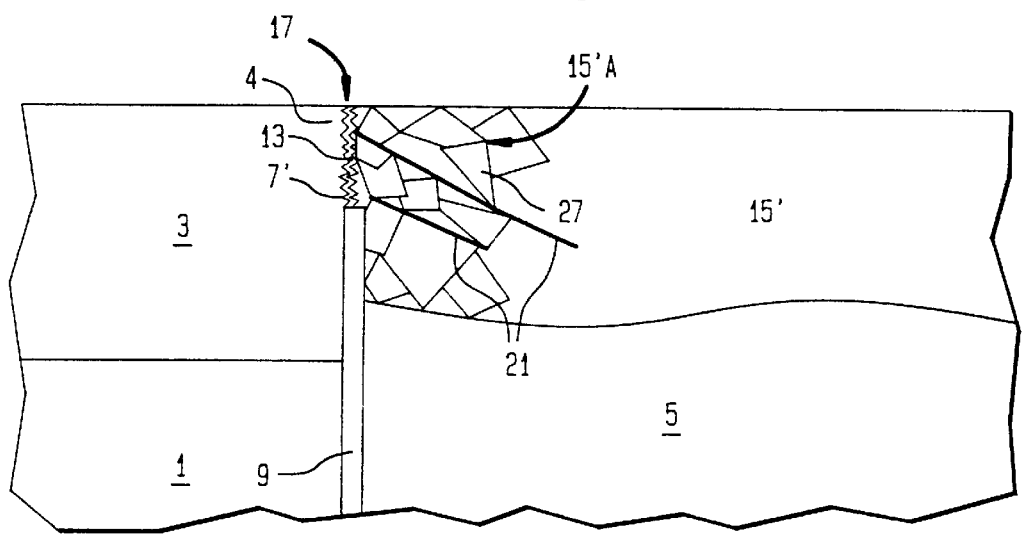
FIG. 6B is a cross-sectional view showing an expanded region of the high-diffusion grain structure of an exemplary embodiment of the present invention.

FIG. 6A shows the prior art, and FIG. 6B shows the effect of the present invention on the adjacent region 15'A, which is formed next to interface 17 formed between polysilicon film 15' and active area 3. FIG. 6A shows interface 17 between surface 7' and 18, and including thin oxide or other film 13. The critical region - adjacent region 15'A can be seen to include crystalline twinning grains 26 which prevent the diffusion of impurities, as depicted by lines 19. When the path of the diffusion (lines 19) is not along a grain boundary, for example when it is orthogonal to the crystalline structure as depicted in FIG. 6A, diffusion of the impurity is suppressed. In the worst case, grain boundaries 26 may be formed parallel to interface 17 through which impurity diffusion is desired. Alternatively, the present invention as depicted in FIG. 6B, depicts the critical area 15'A as having multiple grains 27 within the structure. The multiple grain 27 formation is due to the roughening of the surface 7' of the active area 3 prior to the addition of the film 15 as depicted in FIG. 4.

In FIG. 6B, it can be seen that because of the roughness of surface 7' of the active area 3, and (in the alternate embodiment) also the presence of thin oxide or other film 13 produced prior to introduction of film 15, a multiple grain, diffusion grain structure 15'A results after the thermal treatment as described in conjunction with FIG. 5. The diffusion path of the dopant impurities 21 is seen to coincide with a formed grain structures in the critical region 15'A. This is possible because of the presence of multiple, small grains formed within region 15'A. More grain boundaries are available along the desired direction of diffusion of the impurity. In this manner, the diffusion 21 of impurity atoms through region 15'A, through the interface 17, and into active area 3 is facilitated by the grain structure 27 and occurs at a rate which is on an order of magnitude greater than the diffusion rate of impurity atoms through the crystalline twinning grain structure of the prior art as shown in FIG. 6A. The diffusing impurity atoms enter into active area 3 through adjacent active area 4. The diffused impurity atoms in active area 3 have a substantially uniform distribution in adjacent active area 4.

Returning to FIG. 5, in both cases, the source of the dopant impurities is the highly doped polysilicon electrode region 5 of the trench capacitor. In both cases described in conjunction with FIGS. 6A and 6B, a heat treatment is utilized which simultaneously (a) converts the as-deposited amorphous silicon (film 15 of FIG. 4) into a polysilicon film 15', which includes an adjacent region 15'A and, (b) also urges the diffusion of the dopant impurity as described above.

Figure 7:
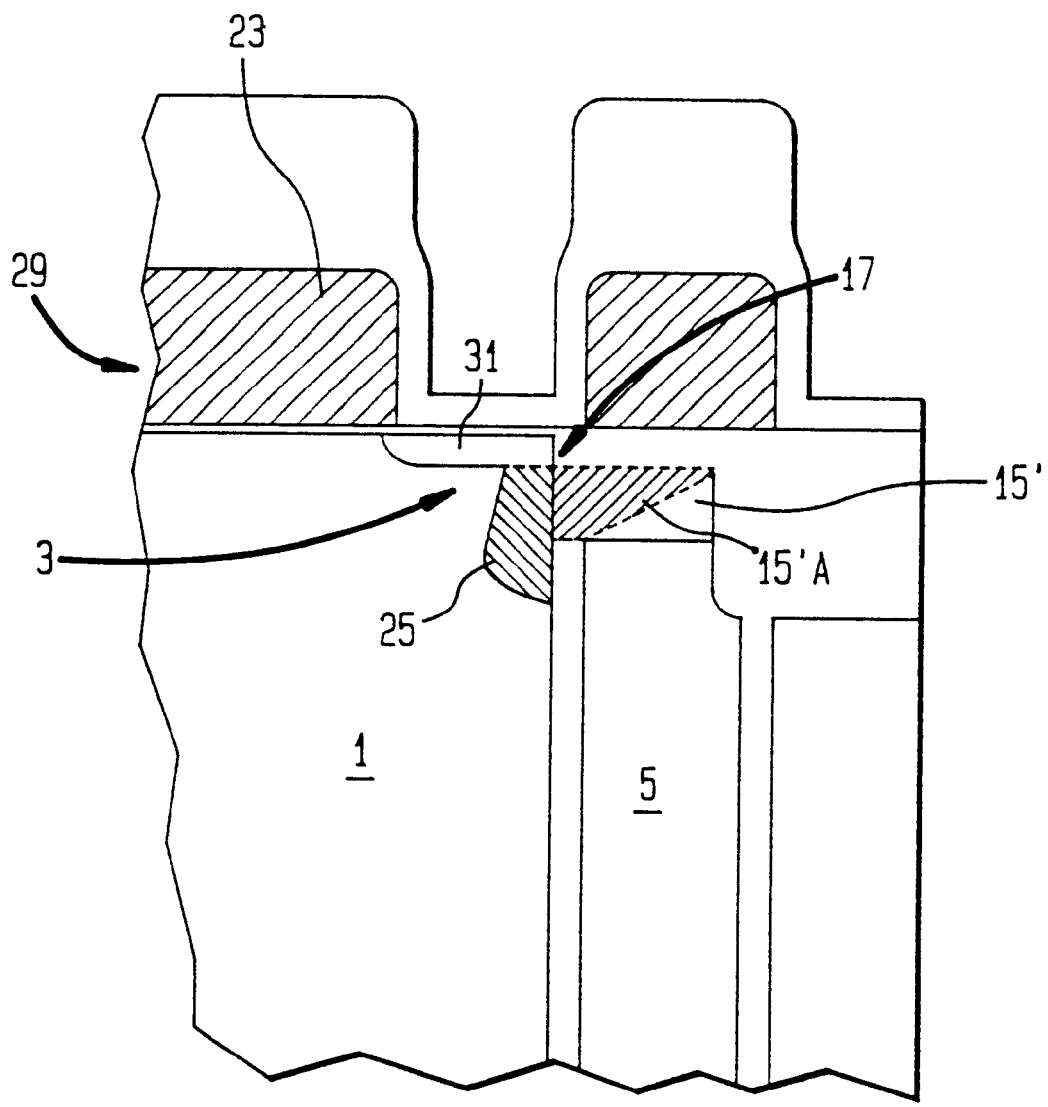
FIG. 7 is a cross-sectional view showing an exemplary embodiment of the present invention in relation to a completed semiconductor device.

FIG. 7 is a cross-sectional view showing the incorporation of the present invention into a semiconductor device comprising a transistor 29 which includes a polysilicon gate 23 and a source/drain region 31 within active area 3 (the other source/drain region necessary for the transistor is not shown). Active area 3 may include another, previously added dopant impurity species. A polysilicon material, doped with an oppositely charged impurity, forms an electrode 5 of a trench capacitor which includes collar oxide 9.

Buried strap 15' includes an adjacent region 15'A. The adjacent region 15'A is next to the interface 17 formed between the active area 3 and the polysilicon film 15'. As a result of the diffusion enabled through multi-grain structure 15'A, by the process of the present invention, an out-diffused buried strap 25 is formed of the oppositely charged impurity within active area 3 of crystalline substrate 1, and connects the source/drain region 31 within active area 3 to the buried strap 15'.

Figure 8A:
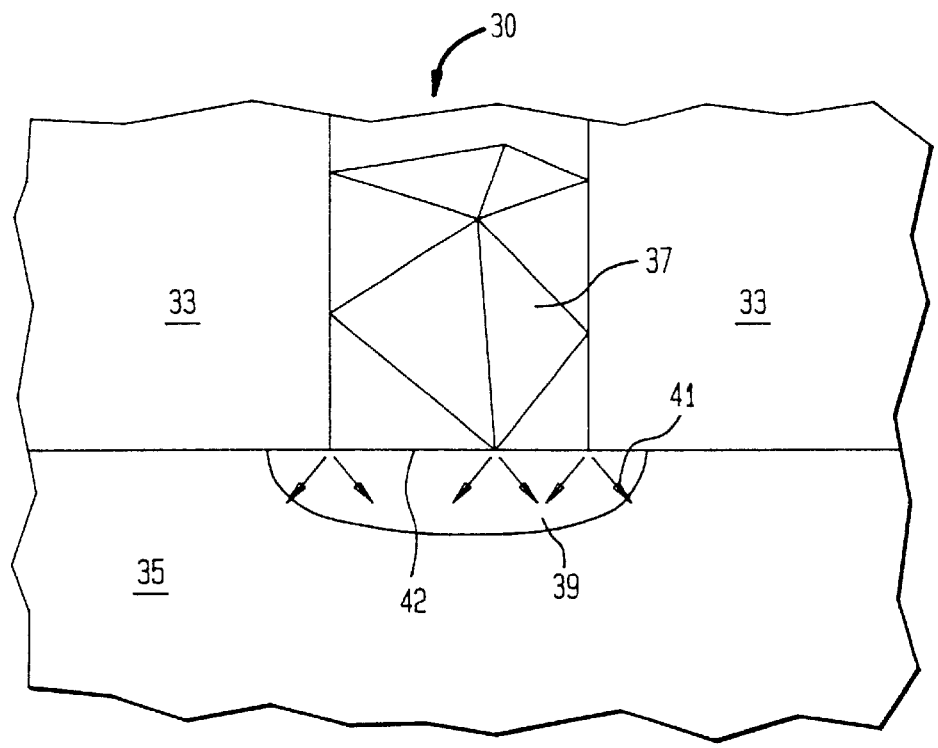
FIG. 8A is a cross-section showing a via plug contacting a source/drain area.
Figure 8B:
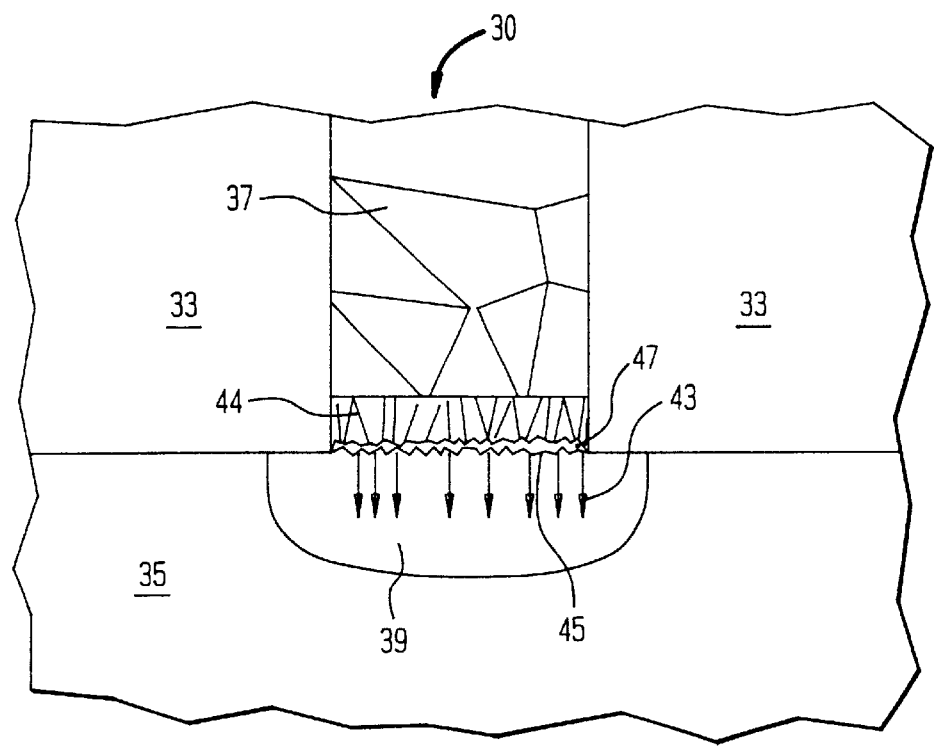
FIG. 8B is a cross-sectional view showing a via plug connected to the source/drain region using the roughened grain structure of the present invention.

FIGS. 8A and 8B depict other applications for use of the present invention. FIGS. 8A and 8B both show a via plug providing an electrical connection to a source/drain region. FIG. 8A shows a via plug as in the prior art, and does not utilize the present invention. In FIG. 8A, via plug 30 fills an opening which had been formed within dielectric film 33 for the purpose of providing electrical connection down to the doped crystalline source/drain region 39 within silicon substrate 35. The interface 42 formed between the polysilicon film 37 forming the via plug 30, and the source drain region 39, does not include a roughened surface. As such, interface 42 provides for a coherent nucleation site between polysilicon film 37 and the doped crystalline source/drain region 39. Hence, when polysilicon film 37 is heat treated, a twinning crystalline grain structure is produced. As such, the diffusion path 41 of impurities from the polycrystalline region to the source/drain region is limited. The diffusion rate is low, and the uniformity of dopant impurities which succeed in diffusing into source/drain region 39, is poor. In comparison, FIG. 8B shows a feature of the present invention incorporated into the structure.

In FIG. 8B, via plug 30 fills an opening formed within a dielectric film 33, and includes a polysilicon film 37 for connection to the doped crystalline source/drain region 39. Source/drain region 39 is formed within a crystalline silicon substrate 35. As a result of the treatment method of the present invention described in conjunction with FIG. 2, roughened surface 45 is formed on crystalline source/drain region 39. This roughened silicon surface 45 together with thin oxide or other film 47, urges the formation of a multiple grain polycrystalline structure in the adjacent region 44 of polysilicon film 37 during thermal processing. In an alternate embodiment, the thin film 47 may not be needed.

The multiple grain polycrystalline structure facilitates the diffusion of impurities from the polysilicon film 37, through the adjacent region 44, and into the source/drain region 39. The multiple, small grain structure of adjacent region 44 provides many grain boundaries along the direction of diffusion. FIG. 8B illustrates that the grains in adjacent region 44 of polysilicon film 37 have a smaller average grain size than the grains in the other portions of polysilicon film 37. Improved dopant uniformity within the source/drain region 39 may be achieved (relative to the prior art as shown in FIG. 8A), because of the multiple, small grains present in adjacent region 44 of the structure of the present invention as shown in FIG. 8B. Diffusion paths 43 of dopant impurities can be seen to be on an order of magnitude higher than the diffusion possible in the prior art structure (FIG. 8A) which does not utilize the treatment procedure of the present invention.

It can be seen by one skilled in the art, that the present invention is not limited to the two specific device applications disclosed herein. Rather, the procedure of the present invention may be used in various applications where a dopant impurity is urged from one material into a second dissimilar crystalline material. As such, it should be understood that the foregoing description of the exemplary embodiments is presented for the purpose of illustrating and describing the main points and features of the present invention. For example, alternate embodiments may utilize a variation of the treatment procedure described herein, to produce a roughening of the surface which causes random multiple nucleation sites which, in turn, effectuates diffusion grain structure to be formed in the adjacent material. Additional variations of the features which comprise the present invention may also be made without departing from the scope and the spirit of the present invention.

What is claimed:

1. A semiconductor device formed within a semiconductor substrate and including a buried strap connecting a polysilicon electrode of a trench capacitor formed within said substrate to an active area formed within said substrate, said buried strap including a first surface in a confronting relationship with at least a second surface of said active area, and having at least a portion extending from said first surface comprised of a high-diffusion grain structure, said high-diffusion grain structure formed in response to a plurality of nucleation sites formed on said second surface of said active area and including multiple grains and multiple grain boundaries therein, wherein said second surface is roughened prior to formation of said buried strap.

2. The semiconductor device according to claim 1, wherein said polysilicon electrode includes dopant impurities, said active area includes a population of said dopant impurities, and said population of said dopant impurities is introduced into said active area by means of diffusion from said polysilicon electrode and through said high-diffusion grain structure.

3. The semiconductor device according to claim 1, wherein said semiconductor device comprises a dynamic random access memory (DRAM) device.

4. A semiconductor device formed within a semiconductor substrate, comprising:
    a trench capacitor including a polycrystalline silicon electrode with dopant impurities;
    an active area formed within said substrate and having a first surface; and
    a buried strap formed sequentially after said active area and connecting said polycrystalline silicon electrode to said active area, said buried strap including i) a second surface in confronting relationship with at least said first surface, and ii) at least a portion extending from said second surface comprising a high-diffusion grain structure, wherein said first surface is roughened prior to said formation of said buried strap.

5. The semiconductor device according to claim 4, wherein said high-diffusion grain structure is formed in response to a plurality of nucleation sites formed on said first surface of said active area.

6. The semiconductor device according to claim 5, wherein said high-diffusion grain structure comprises a polycrystalline silicon adjacent region.

7. The semiconductor device according to claim 6, wherein said active area includes a portion of said dopant impurities, said portion of said dopant impurities diffused from said polycrystalline silicon electrode and through said polycrystalline silicon adjacent region.

8. The semiconductor device according to claim 6, wherein said active area includes an adjacent section adjacent said first surface, said adjacent section includes a portion of said dopant impurities, and a distribution of said portion of dopant impurities within said adjacent section is substantially uniform.

9. The semiconductor device according to claim 5, wherein said active area includes a source/drain region of a transistor.

10. The semiconductor device according to claim 4, wherein said semiconductor device comprises a dynamic random access memory (DRAM) device.

11. The semiconductor device according to claim 4, wherein said first surface is roughened by treating said first surface with dilute hydrofluoric acid.

12. A semiconductor contact device comprising a first material having a first surface and a second material having a second surface in confronting relationship with said first surface, said second material including a portion adjacent said second surface comprising a high diffusion grain structure and formed in response to a plurality of nucleation sites formed on said first surface of said first material prior to the formation of said second material, said plurality of nucleation sites formed due to roughening of said first surface, and said high-diffusion grain structure including multiple grain boundaries and multiple grains having a smaller average grain size than grains in other portions of said second material.

13. The semiconductor contact device according to claim 12, wherein said high diffusion grain structure comprises polycrystalline silicon.

14. The semiconductor contact device according to claim 12, wherein said first material comprises a portion of a silicon substrate, and said second material comprises a silicon plug formed within an opening within a dielectric material formed on said silicon substrate.

15. The semiconductor contact device according to claim 12, further comprising dopant species introduced into said first material by means of diffusion through said high diffusion grain structure region.

16. The semiconductor contact device according to claim 15, wherein said first material comprises a source/drain region formed within a silicon substrate and said second material comprises a via plug comprised of silicon and formed within an opening of a dielectric film formed on said silicon substrate.

17. The semiconductor contact device according to claim 16, wherein said source/drain region is a source/drain region of a transistor within a DRAM device.

18. The semiconductor contact device according to claim 12, wherein said plurality of nucleation sites are formed due to the roughening of said first surface by treating said first surface with dilute hydrofluoric acid.

19. The semiconductor contact device according to claim 18, wherein said high diffusion grain structure is formed upon heating.

20. The semiconductor contact device according to claim 12, further including an oxide film disposed between said first surface and said second surface.

21. The semiconductor contact device according to claim 20, wherein said oxide film includes a thickness of substantially a single atomic layer.

22. A semiconductor device formed within a semiconductor substrate, comprising:
   a first polycrystalline silicon structure with dopant impurities;
   a second structure formed within said substrate and having a second surface; and
   a third structure connecting said first polycrystalline silicon structure to said second structure, said third structure including i) a third surface in confronting relationship with at least said second surface, and ii) at least a portion extending from said third surface comprising a high-diffusion grain structure including multiple grains and multiple grain boundaries therein, wherein said high diffusion grain structure is formed in response to said second surface being roughened prior to formation of said third structure.

23. The semiconductor device according to claim 22, wherein said high-diffusion grain structure is formed in response to a plurality of nucleation sites formed on said second surface.

24. The semiconductor device according to claim 23, wherein said high-diffusion grain structure comprises a polycrystalline silicon adjacent region.

25. The semiconductor device according to claim 24, wherein said second structure includes a portion of said dopant impurities, said portion of said dopant impurities diffused from said first polycrystalline silicon structure and through said polycrystalline silicon adjacent region.

* * * * *